United States Patent [19]

Stierman et al.

[11] Patent Number: 4,931,149
[45] Date of Patent: Jun. 5, 1990

[54] FIXTURE AND A METHOD FOR PLATING CONTACT BUMPS FOR INTEGRATED CIRCUITS

[75] Inventors: Roger J. Stierman, Richardson; Robert J. Lessard, Garland, both of Tex.

[73] Assignee: Texas Instruments Incorporated, Dallas, Tex.

[21] Appl. No.: 295,684

[22] Filed: Jan. 10, 1989

Related U.S. Application Data

[63] Continuation-in-part of Ser. No. 37,760, Apr. 13, 1987, Pat. No. 4,861,452.

[51] Int. Cl.⁵ .................................... C25D 5/02
[52] U.S. Cl. .......................................... 204/15
[58] Field of Search ................................ 204/15

[56] References Cited

U.S. PATENT DOCUMENTS 2,362,228 11/1944 Wright .................................. 204/23
3,536,594 10/1970 Pritchard .......................... 204/275

Primary Examiner—T. M. Tufariello
Attorney, Agent, or Firm—B. Peter Barndt; James T. Comfort; Melvin Sharp

[57] ABSTRACT

This disclosure describes a plating fixture to hold a silicon wafer containing integrated circuits in a metal plating bath. The wafer is coated with photoresist to a thickness equal to the desired bump height and the desired bump locations patterned by standard photolithographic techniques. The wafer is then loaded in the fixture and the fixture placed in the plating bath so that the patterned side of the wafer is facing up and the plating anode is located directly above the wafer. Systems presently on the market have the wafer positioned with the patterned side facing down and the anode located below it, or the wafer faces sideways and the anodes are access from it. These present systems allow air to be entrapped in the pattern of the photoresist, lowering yield by under plating or uneven plating of the bumps on the wafer. This disclosure prevents such yield loss and also allows cleanups on the wafer after it is loaded in the fixture.

7 Claims, 5 Drawing Sheets

FIXTURE AND A METHOD FOR PLATING CONTACT BUMPS FOR INTEGRATED CIRCUITS

This application is a Continuation-In-Part of U.S. Pat. application Ser. No. 037,760, filed Apr. 13, 1987 now Pat. No. 4,861,452.

BACKGROUND OF THE INVENTION

1. Field of the Invention

This invention relates to integrated circuit device fabrication, and more particularly, to a fixture for electroplating metal bumps on the metallized circuit patterns on a sxemiconductor wafer.

2. Description of the Related Art

Metal bump contacts may be used in flip chip technology electrically to connect an integrated circuit to a substrate, and may be used in TAB (tape automated bonding) technology electrically to connect an integrated circuit to a leadframe. Typically, the bumps are electroplated onto metallized integrated circuit contacts on the surface of a semiconductor wafer at locations determined by a photoresist pattern on the wafer.

A common prior art technique for electroplating bump contacts on wafers was implemented by patterning the face of the wafer with photoresist, covering the backside of the wafer with photoresist or wax to prevent plating of the backside, then placing the wafer in a rack which holds the wafer vertically in a plating bath while carrying out the bump plating process.

U.S. Pat. No. 4,137,867 discloses a fixture for bump plating in which the backside of a wafer to be plated requires no coating to prevent plating of the backside. This fixture enables a cost savings to be realized by reducing the number of processing steps for bump plating. That is, the steps involved in coating the backside of a wafer are no longer necessary. This is made possible by a fixture which holds a wafer face down at the surface of the plating bath. Only the face of the wafer makes contact with the plating bath, while the backside is kept dry by directing a flow of nitrogen gas against the backside.

Both of the above prior art techniques result in a lowered yield due to air bubbles getting trapped in the bump vias(the cylindrically shaped cavities in the photoresist where bumps will be plated on the wafer) in the photoresist on the wafer face. The bubbles displace the plating solution in the vias and either prevent bumps from being plated where the bubbles are, or cause bumps to be plated which have inadequate shape or height. It is necessary to circulate the plating solution, or bath, during the plating process, and it is extremely difficult to circulate the bath without generating bubbles. When plating is performed on wafers having vertical or face down orientations in the plating bath, the possibility exists that air bubbles will be trapped in the vias. With these prior art wafer orientations, thickening the photoresist coating on the face of a vafer increases the likelihood that bubbles will be trapped in the vias.

When used wsith TAB or flip chip technology, it is desirable that the bumps be tall. Studies, including computer stress modeling, show that bumps give more stress relief, and thus greater reliability, than shorter bumps. The height of a wall formed bump is equal to the thickness of the photoresist on the face of the wafer. Since the depth of the vias is equal to the thickness of the photoresist, it is apparent that deep vias produce tall bumps. The deep vias are more prone to trapping bubbles than are the shallower vias when the vias are on wafers being bump plated by one of the prior art processes in which the wafers have either a vertical or face down orientation during plating. The aspect ratio of a bump (or via) is defined as height (depth) divided by width. Studies have shown that when the aspect ratio reaches approximately 0.4 or greater, many bubbles become trapped in the vias of wafers plated by the method disclosed in U.S. Pat. No. 4,137,867. When the aspect ratio is less than approximately 0.4, bubbles which rise in the fixture and touch the face of the wafer can be made to move along the face of the wafer to escape at the edge of the wafer by the circulation of the plating bath. Thus, the bubbles which reach the surface of the wafer do not become trapped in the vias. When the critical ratio of approximately 0.4 is reached, the flow of the bath is no longer able to sweep bubbles out of the vias, and plating may be prevented entirely in vias where there are bubbles, or the bumps may be misshapen.

Another important feature concerning bumps is their planarity. Planarity can be expressed in terms of the difference in height between the tallest and shortest bumps on a single integrated circuit chip or on an entire wafer. For example, if all bumps on a single chip were exactly the same height, their top surfaces would lie in a common plane and their planarity difference would be zero. If the tallest bump on a chip is 30 microns high and the shortest is 28 microns, then the planarity difference for the chip is 2 mirons. When the planarity difference is low, planarity is said to be high.

Planarity is important because it influences the yield of good integrated circuits at assembly. Methods for making electrical contact with the bumps, using the TAB of flip chip processes, give maximum yields when planarity is high, and yeild decreases as planarity decreases. When planarity is low, the likelihood increases that one of the bumps will not form a good electrical contact. This is especially true with flip chips since the substrate to be connected electrically to the bumps has a surface which is substantially planar. Loss of contact with a single bump on a chip will cause the entire chip to fail assembly. Low Planarity can be caused by bubbles being trapped in the bump vias, where the bubbles either cause the plated in vias not having trapped bubbles, or prevent bumps from being plated at all. As the number of bumps per chip increases, the chance that one of the bump vias on a chip will catch a bubble increases.

When wafers are bump plated in a face down orientation, the only known way to plate tall bumps and at the same time prevent planarity yield loss is to pattern photoresist which has a low aspect ratio, i.e., shallow bump vias. To get a tall bump when the aspect ratio is low, the bump must be overplated so that it has a mushroom shape. The head of the "mushroom" is formed by plated metallization which spreads laterally along the suface of the photoresist after the plating process has formed a bump as high as the thickness of the photoresist. This overplate, or mushroom head, can lock the photoresist to the wafer, complicating the final removal of the photoresist. Also, the bumps can be placed no closer together than the amount of overplate for two adjacent bumps, limiting the bump density on a chip. For example, if the bump overplate is 1 mil then the bumps must have at least 2 mils separation between then on the wafer.

A further disadvantage of the fixtures disclosed in U.S. Pat. No. 4,137,867 is that any presoak or cleanup treatments needed by the wafers prior to plating must be done before the wafers are mounted in the fixtures, since the fixtures cannot easily be moved, if at all. Presoak of cleanup refers to the removal of oxides and the like from the face of a wafer prior to beginning the plating process itself. If a wafer dries out after cleanup, oxides reform on it surface and the wafer must be recleaned in the cleanup bath. To prevent reoxidation, a wafer must be placed in the plating bath within approximately ten seconds after removal of the wafer from the cleanup bath.

SUMMARY OF THE INVENTION

This invention provides a transportable bump plating fixture for holding a wafer in a face up orientation in a plating bath. The fixture includes an elastomer pad which contacts the back of the wafer and forms a seal which prevents the plating bath from coming into contact with the back of the wafer. The fixture also includes a means for forming a cathodic electrical connection to the metallization on the face of the wafer, and further includes a plating anode disposed above the face of the wafer. The fixture is open to the flow of the plating bath over the face of the wafer and between the face of the wafer and the anode.

The face up orientation of the wafer in the fixture of the invention prevents bubbles from being trapped in the bump vias, and thus eliminates trapped bubbles as a cause of low planarity or deformed individual bumps. Tests have shown that the planarity of tall bumps produced in the fixture of the invention is substantially higher than the planarity of tall bumps produced by the prior art methods.

The fixture of this invention makes it possible for thick photoresist to be used to form tall bumps straight sides and flat tops with no overplating, i.e., cylindrically shaped bumps. This allows integrated circuit devices to be fabricated in which the bumps have good strain relief. The absence of overplate also allows the bumps to be placed in close proximity to one another, which means that an integrated circuit chip can have a high density of electrical contacts (bumps) to the external world.

The back, of a wafer mounted in the fixture of this invention, is protected by the elastomer pad from exposure to the plating bath, thus no extra steps are required to protect the back with photoresist, wax or other such applied protective coating.

The fixture of this invention allows a wafer to be mounted in it and then soaked in a cleanup solution such as water or an acid (e.g., sulphuric acid) pickling or descale solution for cleaning up the face of the wafer by removing oxides. The entire fixture, with the wafer, can then be removed from the cleanup solution and transported to the plating bath without having to handle the wafer itself. Not having to handle the wafer directly, minimizes the chances of contaminating or otherwise damaging the wafer, and minimizes the time requires to transfer the wafer from the cleanup bath to the plating solution. Thus, the fixture provided by the invention makes it possible to transfer wafers from the cleanup bath to the plating bath with little risk that oxides will reform on the faces of the wafers.

BRIEF DESCRIPTION OF THE DRAWING FIGURE

DETAILED DESCRIPTION OF THE PREFERRED EMBODIMENTS

Figure 1:
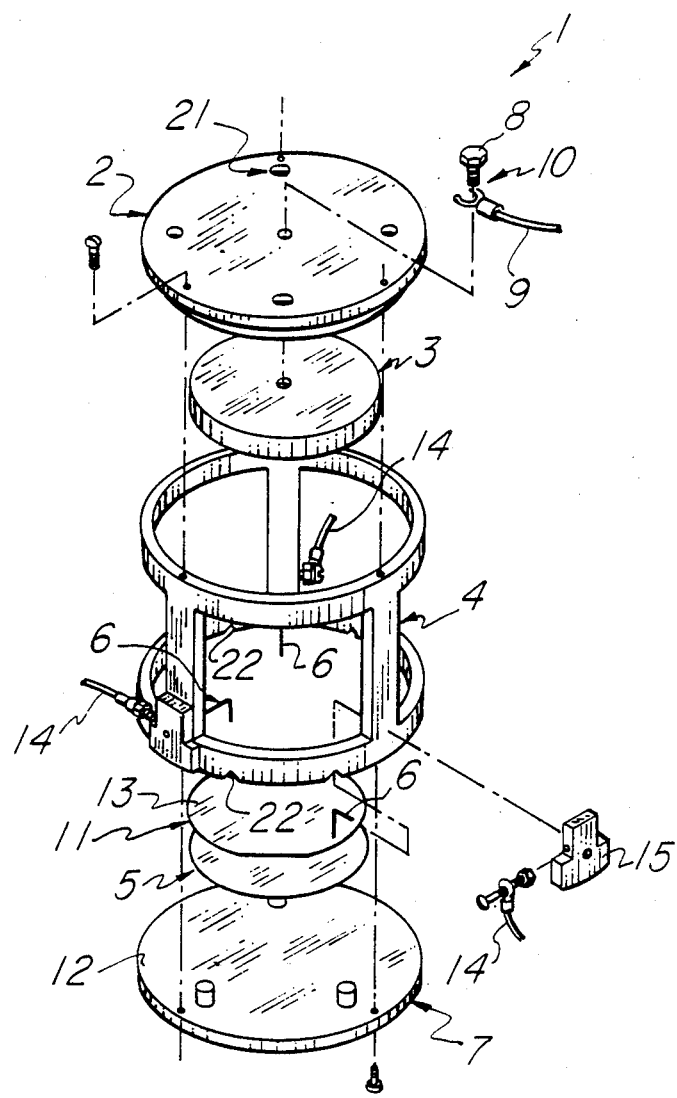
FIG. 1 is an exploded isometric view of an embodiment of the fixture of the invention.

As seen in FIG. 1, the fixture 1 includes a top plate 2, an anode 3, a frame 4, an elastomer pad 5, three cathode needles 6, and a base plate 7. The top plate 2 and base plate 7 are constructed of an electrically insulating material such as plastic, and although the frame 4 is preferably an insulator, it may be electrically conductive if it is coated with insulation resistant to the plating bath and cleanup solutions.

Figure 2:
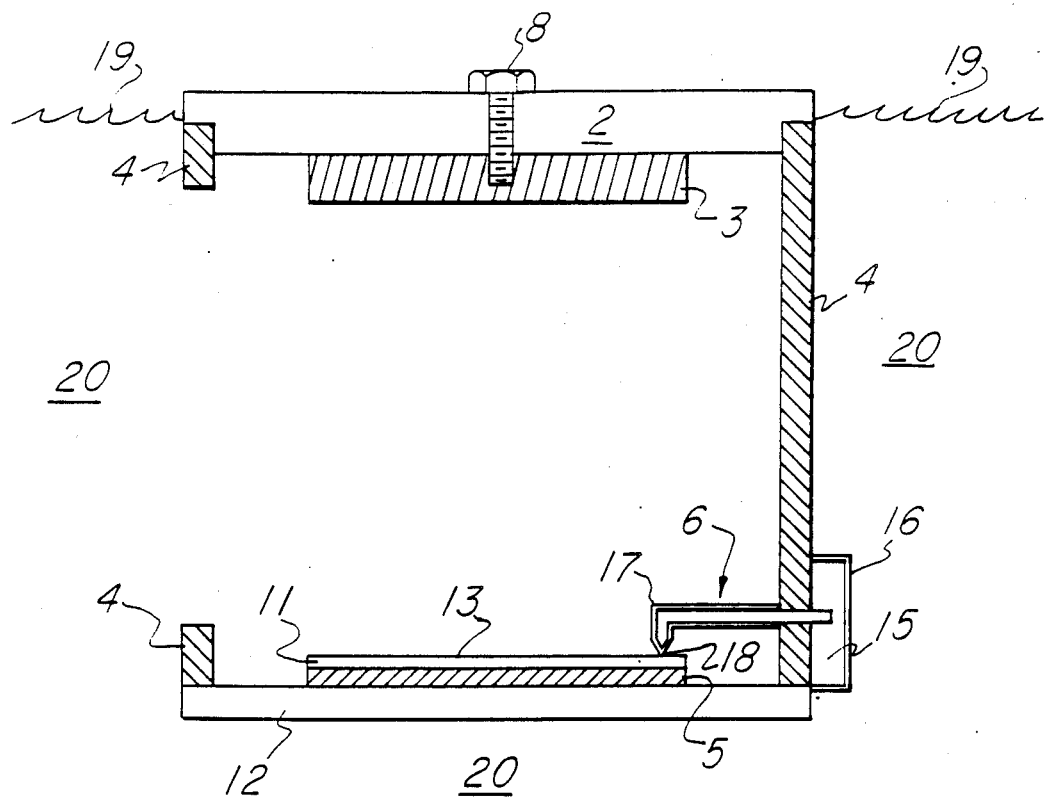
FIG. 2 is a side sectional view of the embodiment of the invention shown in FIG. 1.

The anode 3 is positioned at the top of the fixture 1 and is attached to the top plate 2 by means of anode screw 8, as can be seen in both FIGS. 1 and 2. The positive terminal of the plating power supply is connected to the anode 3 by means of anode wire 9 and the anode screw 8 at connection 10. The anode 3 is sized to be the same diameter or slightly less than that of the wafer 11 to be plated, and the frame 4 sets the anode to wafer distance at the optimum distance for the particular plating process to be used.

The wafer 11 to be plated is placed face 13 up on the elastomer pad 5 which is positioned on the upper surface 12 of the base plate 7. The three cathode needles 6 are located 120 degrees apart and make electrical contact with the wafer 11 just inside the periphery of the wafer. The cathode needles contact the metallization on the face 13 of the wafer 11 and are electrically connected to the negative terminal of the plating supply by means of cathode wires 14 and cathode connectors 15. As indicated in FIGS. 1 and 2, the cathode needles 6 each have one end anchored in one of the cathode connectors 15 where they make mechanical and electrical contact with the cathode connectors.

The cathode connectors 15 and the cathode needles 6 are electrically insulated from the plating bath at 16 and 17 respectively, as seen in FIG. 2. The insulation at 16 and 17 is resistant to the surrounding plating bath. The cathode needle points 18, however, are not insulated so that they can penetrate the photoresist on the wafer 11 and make electrical contact with the underlying metallization on the face 13 of the wafer 11. The insulation minimizes the area of the negatively biased conductors which get exposed to the plating bath so that unwanted plating of the fixture 1 parts is minimized.

In another embodiment of the invention, the frame 4 is electrically conductive and is covered with electrical insulation which is resistant to the plating bath, in like manner to the cathode connectors 15. In this embodiment, the cathode connectors 15 can be eliminated and electrical connection of the cathode needles 6 to the negative terminal of the plating power supply is achieved through the frame 4. The frame 4 can be electrically connected to the plating power supply at a point on the frame which is at or above the plating bath surface 19.

The cathode needle points 18 exert a spring force upon the wafer 11 sufficiently great to ensure good electrical contact of the points with metallization on the face 13 of the wafer 11. This force also presses the wafer 11 against the elastomer pad 5 to form a good seal between the back of the wafer 11 and the elastomer pad 5 to prevent the plating bath from coming into contact with the wafer back. The elastomer pad also functions as a cushion to help prevent the force exerted by the cathode needles 6 from fracturing the wafer 11. Preferably, the elastomer pad 5 is made of a resilient material such as silicone rubber or neoprene which is resistant to the cleanup solution and the plating bath.

During the plating process the fixture 1 is immersed in the plating bath 20 no deeper than is necessary to ensure that the anode 3 is completely submerged in the bath, as illustrated in FIG. 2. As seen in FIG. 2, enough of the top plate 2 is above the plating bath surface 19 to keep the anode screw 8 and the electrical connection 10 (shown in FIG. ) of the anode wire 9 to the anode screw 8 above the plating bath surface 19. In the embodiment of the invention where the frame 4 is electrically connected to the plating power supply through the frame 4, the frame is connected to a wire from the power supply at a terminal which also is above the plating bath surface 19. Such a terminal can be formed in similar fashion to anode screw 8, where such a screw would penetrate the top plate 2 and make electrical contact with the frame 4. In either embodiment, the fixture can be held in the plating bath 20 in the position shown in FIG. 2 by any conventional means, such as a support under the base plate 7.

As can be seen in FIG. 1, air holes 21 are provided in the top plate 2 to allow air bubbles around the anode 3 to escape during plating. Drain openings 22 at the bottom of the fixture 1 allow cleanup and plating sulutions to drain off the wafer 11 when the fixture is removed from those baths.

Figure 3:
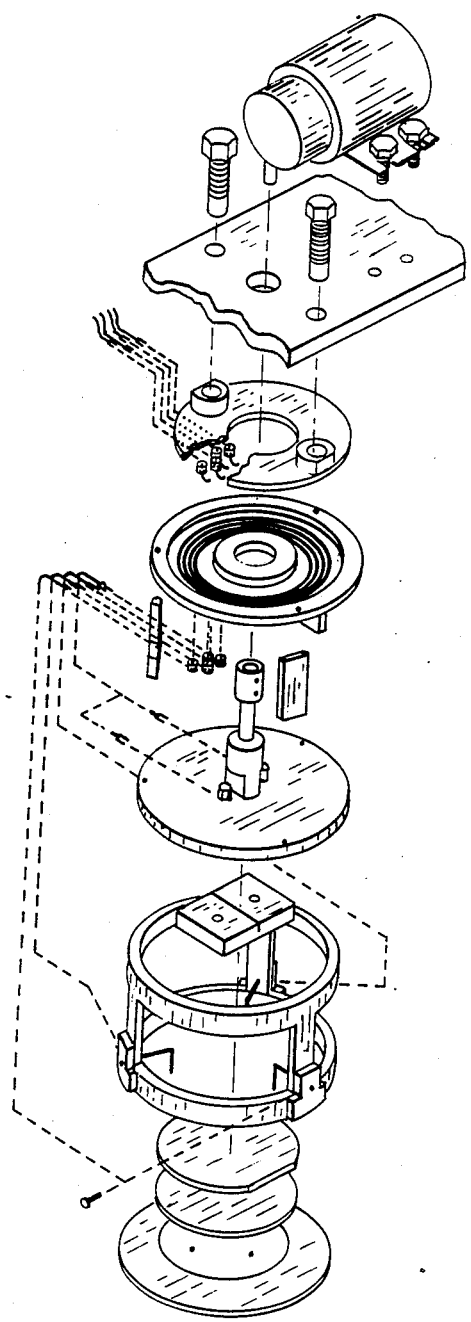
FIG. 3 is an exploded isometric view of a useful embodiment of the invention.

In an alternative embodiment, shown in FIG. 3, a drive mechanism 31 is coupled to fixture 1. Drive mechanism 31 includes a motor 23 which is coupled through a shaft 24 to fixture 1. Motor 23 can be any suitable electric or other type motor and is affixed to a baseplate 28 using a plurality of mounting devices 29. Baseplate 28 is affixed to brush holder 27 using a plurality of brush holder mounting devices 30. A plurality of brushes 26 are mechanically attached to brush holder 27 and electrically connected to the anode wire 9 and the cathode wire 14.

Fixture 1 as shown in FIG. 3 includes a slip ring holder 32 having a plurality of slip rings 25, a shaft, a top plate 2, an anode 3, and a frame 4. Slip ring holder 32 is attached to top plate 2 which is coupled through shaft 24 to motor 23 as described above. Other useful embodiments could employ a stationary anode 3 because it is not essential that the anode by moving relative to the wafer face 13. A plurality of slip ring contacts 33 are connected to the the slip rings 25 and supply anode 3 through anode wire 9 and cathode needle points 18 through cathode wire 14 as described above.

Figure 4:
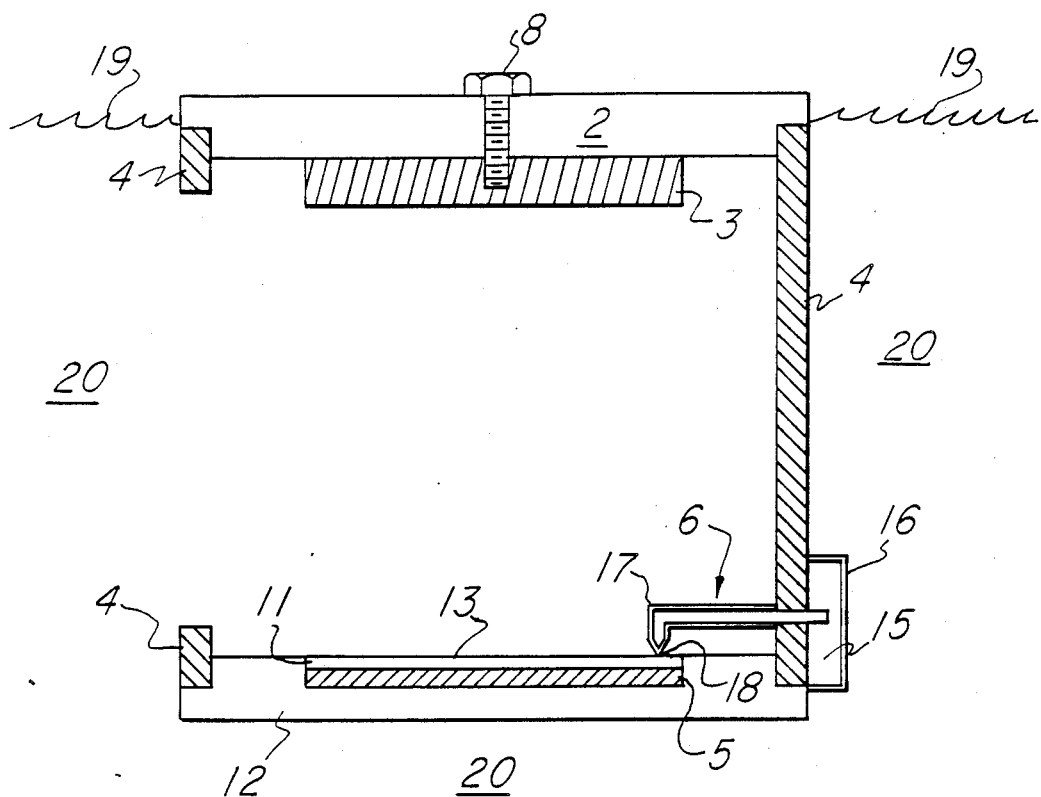
FIG. 4 is a side sectional view of the embodiment of the invention shown in FIG. 3.

FIG. 4 shows fixture 1 in plating bath 20. Fixture 1 is identical to the earlier described embodiments except that in this case, base plate upper surface 12 has a depressed area 34 just deep enough to ensure that the wafer face 13 is planar with the base plate upper surface 12 when wafer 11 is placed atop an elastomer pad 5 as described in the above embodiments.

In operation, a wafer 11 is placed on elastomer pad 5 and the fixture 1 placed in plating bath 20. The motor 23 is energized thereby starting rotation of the shaft 24 and fixture 1. Plating current is then applied through the anode wire 9 to anode 3 and through the cathode needle points 18 to cathode wire 14 as described for the previous embodiments.

Figure 5:
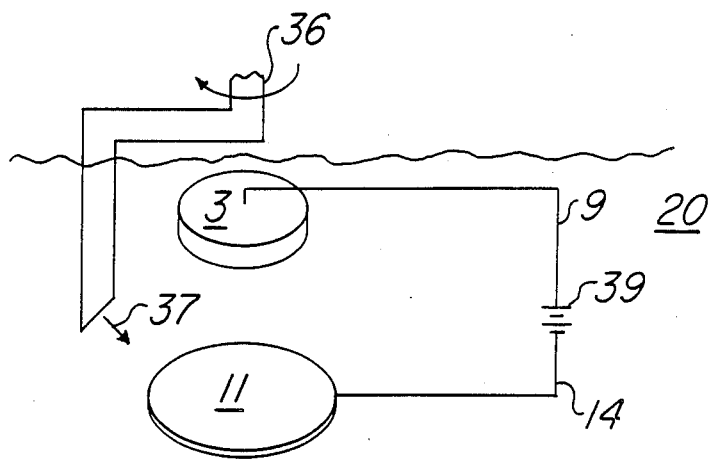
FIG. 5 is a side view of another embodiment of the invention.

FIG. 5 depicts another useful embodiment in which the plating bath 20 is circulated using a rotating pipe 36 which rotates a nozzle 37 which is discharging plating solution. In this embodiment, the wafer 11 is held stationary and face up in the plating bath 20. It should be noted that any method of circulating the plating bath 20 so that the wafer is plated in a constantly changing circulation current that changes direction with respect to the wafer will meet the requirements of this process.

What is claimed:

1. A method of plating bumps on metallization on the face of a wafer, comprising the steps of:
   (a) placing a wafer face up on a pad in a bump plating fixture so that the back of the wafer abuts the pad, a face of the wafer to be plated is coplanar a face of a base plate in the fixture and the wafer is disposed below an anode in the fixture;
   (b) placing a cathode needle against the metallization on the face of the wafer to effect electrical contact action with the metallization; and
   (c) creating relative motion between a plating bath and the face of the wafer to be plated.

2. The method claim 1 wherein the step of placing a cathode needle against the metallization on the face of the wafer also causes the back of the wafer to press against a pad to form a high integrity seal to prevent the plating bath from coming into contact with the back of the wafer.

3. The method claim 1 wherein the step of creating relative motion between a plating bath and the face of the wafer to be plated includes the step of rotating the fixture.

4. The method claim 1 wherein the step of creating relative motion between a plating bath and the face of the wafer to be plated includes the step of rotating a flow of plating solution about a normal to the face of the wafer.

5. The method of claim 1 further comprising the steps of:
   (a) inserting the bump plating fixture with the wafer into a clean up or presoak bath;
   (b) removing the fixture with the wafer from the clean up or presoak bath; and
   (c) inserting the bump plating fixture with the wafer into the plating bath.

6. The method of claim 4 wherein the step of inserting the bump plating fixture with the wafer into the plating bath is carried out with the limitation that the fixture is inserted into the plating bath only far enough as is necessary to just cover the anode.

7. The method of claim 1 further comprising the steps of:
   (a) electrically connecting the anode to the positive terminal of a plating power supply; and
   (b) electrically connecting the cathode needle to the negative terminal of the plating power supply.

* * * * *